United States Patent
Qi et al.

(10) Patent No.: US 10,084,145 B2
(45) Date of Patent: Sep. 25, 2018

(54) DOPING ENGINEERED HOLE TRANSPORT LAYER FOR PEROVSKITE-BASED DEVICE

(71) Applicant: OKINAWA INSTITUTE OF SCIENCE AND TECHNOLOGY SCHOOL CORPORATION, Kunigami-gun, Okinawa (JP)

(72) Inventors: Yabing Qi, Kunigami-gun (JP); Min-Cherl Jung, Kunigami-gun (JP); Sonia Ruiz Raga, Kunigami-gun (JP)

(73) Assignee: OKINAWA INSTITUTE OF SCIENCE AND TECHNOLOGY SCHOOL CORPORATION, Okinawa (JP)

( * ) Notice: Subject to any disclaimer, the term of this patent is extended or adjusted under 35 U.S.C. 154(b) by 0 days.

(21) Appl. No.: 15/523,500

(22) PCT Filed: Nov. 5, 2015

(86) PCT No.: PCT/JP2015/005541
§ 371 (c)(1),
(2) Date: May 1, 2017

(87) PCT Pub. No.: WO2016/072092
PCT Pub. Date: May 12, 2016

(65) Prior Publication Data
US 2017/0338430 A1    Nov. 23, 2017

Related U.S. Application Data

(60) Provisional application No. 62/075,807, filed on Nov. 5, 2014.

(51) Int. Cl.
*H01L 51/42* (2006.01)
*H01L 51/00* (2006.01)

(52) U.S. Cl.
CPC ........ *H01L 51/4246* (2013.01); *H01L 51/002* (2013.01); *H01L 51/4293* (2013.01)

(58) Field of Classification Search
CPC ............. H01L 51/4246; H01L 51/4293; H01L 51/002
See application file for complete search history.

(56) References Cited

U.S. PATENT DOCUMENTS 6,559,375 B1 * 5/2003 Meissner ............... B82Y 10/00
                                                    136/252
7,683,536 B2    3/2010 Forrest et al.
(Continued)

FOREIGN PATENT DOCUMENTS

JP    2009-32661 A    2/2009
JP    2014-140000 A   7/2014
(Continued)

OTHER PUBLICATIONS

International Search Report and Written Opinion dated Jan. 26, 2016, issued in counterpart International Application No. PCT/JP2015/005541 (8 pages).
(Continued)

*Primary Examiner* — Golam Mowla
(74) *Attorney, Agent, or Firm* — Westerman, Hattori, Daniels & Adrian, LLP

(57) ABSTRACT

An optoelectronic device is provided, the device comprising an active layer comprising organometal halide perovskite and a hole transport layer (HTL) formed by vacuum evaporation and configured to transport hole carriers. The HTL includes a first sublayer comprising a hole transport material (HTM) doped with an n-dopant and disposed adjacent to the active layer, a second sublayer comprising the HTM that is undoped and disposed adjacent to the first sublayer, and a third sublayer comprising the HTM doped with a p-dopant and disposed adjacent to the second sublayer. The doping concentration of the n-dopant for the n-doped sublayer is
(Continued)

determined to match the highest occupied molecular orbital energy level of the n-doped sublayer with the valence band maximum energy level of the perovskite active layer.

15 Claims, 12 Drawing Sheets

(56) References Cited

U.S. PATENT DOCUMENTS

| | | | |
|---|---|---|---|
| 8,778,511 B2 | 7/2014 | Adamovich et al. | |
| 9,112,163 B2* | 8/2015 | Uhrich | H01L 51/4246 |
| 2005/0110005 A1* | 5/2005 | Forrest | H01L 51/0504 257/40 |
| 2011/0001128 A1* | 1/2011 | Kim | B82Y 10/00 257/40 |
| 2011/0121722 A1 | 5/2011 | Takashima et al. | |
| 2011/0248249 A1* | 10/2011 | Forrest | H01L 51/5016 257/40 |
| 2011/0266529 A1* | 11/2011 | Zhao | B82Y 10/00 257/40 |
| 2013/0160829 A1* | 6/2013 | Uhrich | B82Y 10/00 136/255 |
| 2013/0167931 A1* | 7/2013 | Hildebrandt | B82Y 10/00 136/263 |
| 2017/0338430 A1* | 11/2017 | Qi | H01L 51/4246 |

FOREIGN PATENT DOCUMENTS

| | | |
|---|---|---|
| WO | 2014/045021 A1 | 3/2014 |
| WO | 2015/170445 A1 | 11/2015 |
| WO | 2016/021112 A1 | 2/2016 |

OTHER PUBLICATIONS

Xing et al., "Low-temperature solution-processed wavelength-tunable perovskites for lasing", Nature Materials, Mar. 2014, vol. 13, pp. 476-480 (5 pages).

Tan et al., "Bright light-emitting diodes based on organometal halide perovskite", Nature Nanotechnology, Sep. 2014, vol. 9, pp. 687-692 (6 pages).

Eperon et al., "Formamidinium lead trihalide: a broadly tunable perovskite for efficient planar heterojunction solar cells", Energy Environ. Sci., 2014, 7, pp. 982-988 (7 pages).

Liu et al., "Efficient planar heterojunction perovskite solar cells by vapour deposition", Nature, 2013, vol. 501, pp. 395-398 (8 pages).

Burschka et al., "Sequential deposition as a route to high-performance perovskite-sensitized solar cells", Nature, Jul. 2013, vol. 499, pp. 316-320 (5 pages).

Hawash et al., "Air-Exposure Induced Dopant Redistribution and Energy Level Shifts in Spin-Coated Spiro-MeOTAD Films", Chem. Mater., 2015, 27, pp. 562-569 (9 pages).

Ono et al., "Air-Exposure-Induced Gas-Molecule Incorporation into Spiro-MeOTAD Films", J. Phys. Chem. Lett., 2014, 5, pp. 1374-1379 (7 pages).

Chan et al., "Incorporation of cobaltocene as an n-dopant in organic molecular films", J. Appl. Phys., 2007, 102, pp. 014906 (6 pages).

Chan et al., "Molecular n-Type Doping of 1,4,5,8-Naphthalene Tetracarboxylic Dianhydride by Pyronin B Studied Using Direct and Inverse Photoelectron Spectroscopies", Adv. Funct. Mater., 2006, 16, pp. 831-837 (7 pages).

Meyer et al., "Transition Metal Oxides for Organic Electronics: Energetics, Device Physics and Applications", Adv. Mater., 2012, 24, pp. 5408-5427 (20 pages).

Qi et al., "Solution doping of organic semiconductors using air-stable n-dopants", Appl. Phys. Lett., 2012, 100, pp. 083305 (5 pages).

Qi et al., "Use of a High Electron-Affinity Molybdenum Dithiolene Complex to p-Dope Hole-Transport Layers", J. Am. Chem. Soc., 2009, 131, pp. 12530-12531 (2 pages).

Chan et al., "Decamethylcobaltocene as an efficient n-dopant in organic electronic materials and devices", Organic Electronics, 2008, 9, pp. 575-581 (7 pages).

Gao et al., "Controlled p doping of the hole-transport molecular material N,N'-diphenyl-N,N'-bis(1-naphthyl)-1,1'-biphenyl-4,4'-diamine with tetrafluorotetracyanoquinodimethane", J. Appl. Phys., 2003, vol. 94, pp. 359-366 (8 pages).

Zhao et al., "Effective hole extraction using MoOx-Al contact in perovskite CH3NH3PbI3 solar cells", Appl. Phys. Lett., 2014, 104, pp. 213906 (5 pages).

Li, H. et al, "A Simple 3,4-Ethylenedioxythiophene Based Hole-Transporting Material for Perovskite Solar Cells", Angewandte Chemie International Edition, Apr. 14, 2014, vol. 53, No. 16, pp. 4085-4088; cited in Extended (supplementary) European Search Report.

Pathak, S. K. et al, "Performance and Stability Enhancement of Dye-Sensitized and Perovskite Solar Cells by Al Doping of TiO2", Advanced Functional Materials, Jul. 22, 2014, vol. 24, No. 38, pp. 6046-6055; cited in Extended (supplementary) European Search Report.

Extended (supplementary) European Search Report dated Oct. 13, 2017, issued in counterpart European Application No. 15856744.6. (6 pages).

Office Action dated Jun. 5, 2018, issued in counterpart Japanese Application No. 2017-523004, with English machine translation. (7 pages).

\* cited by examiner

[Fig. 2]
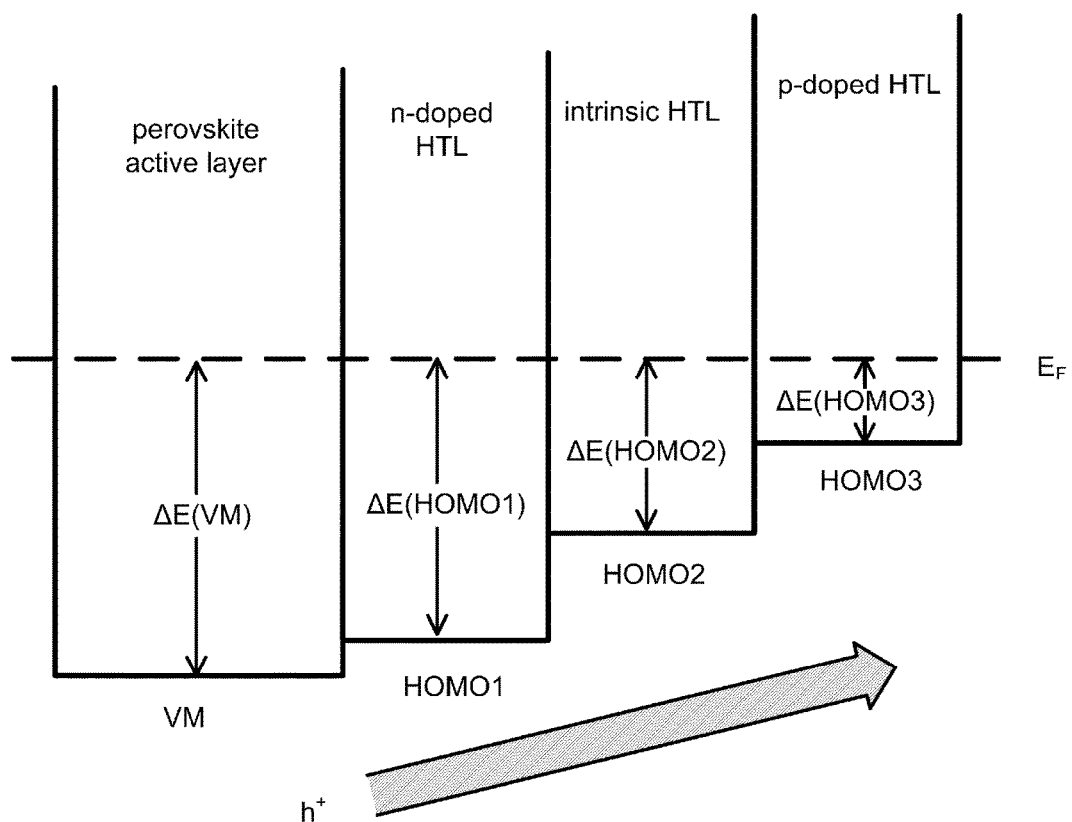

[Fig. 3]
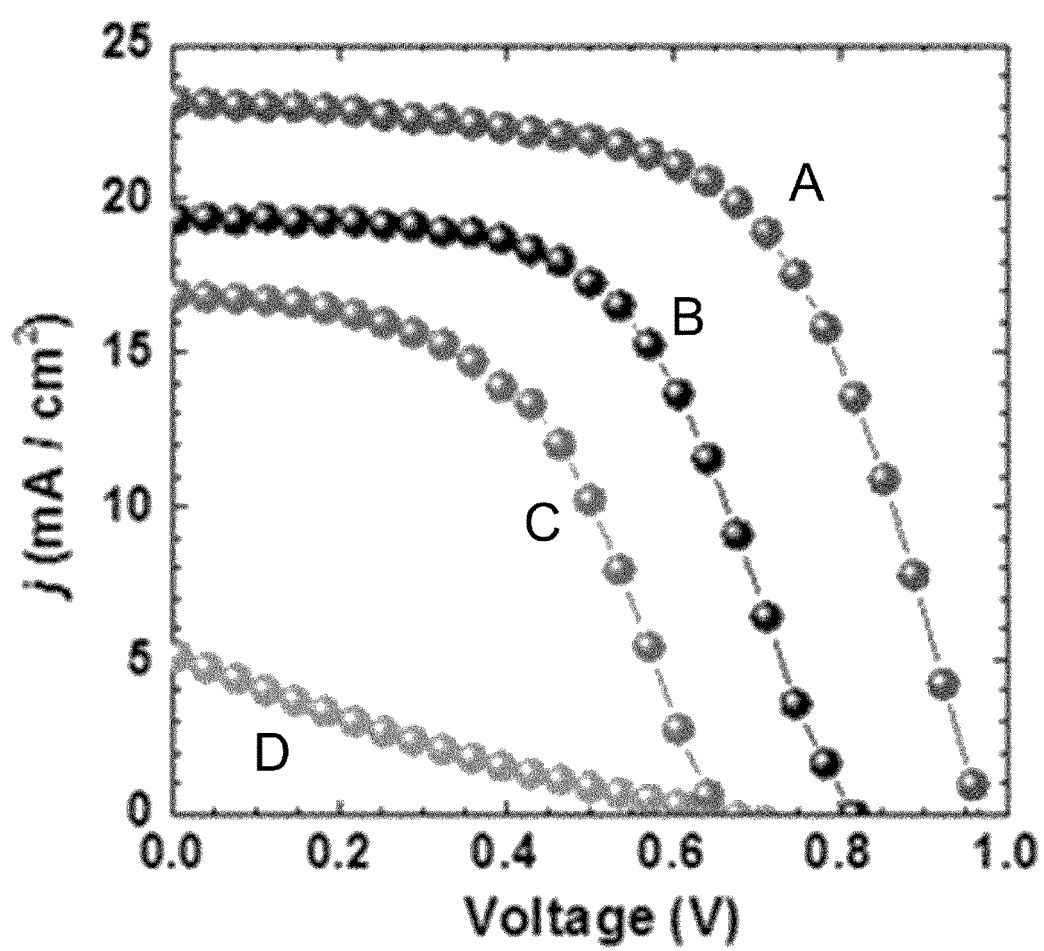

[Fig. 4]
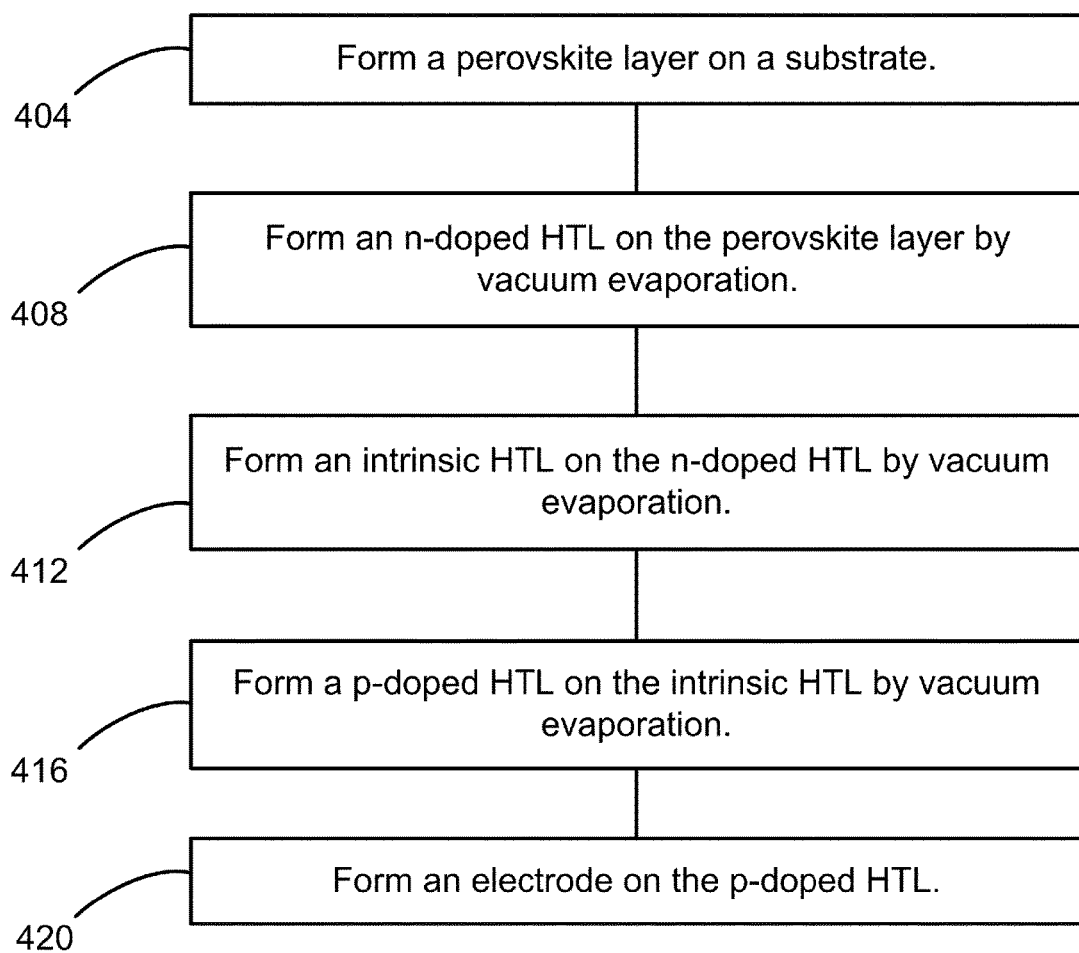

[Fig. 5]
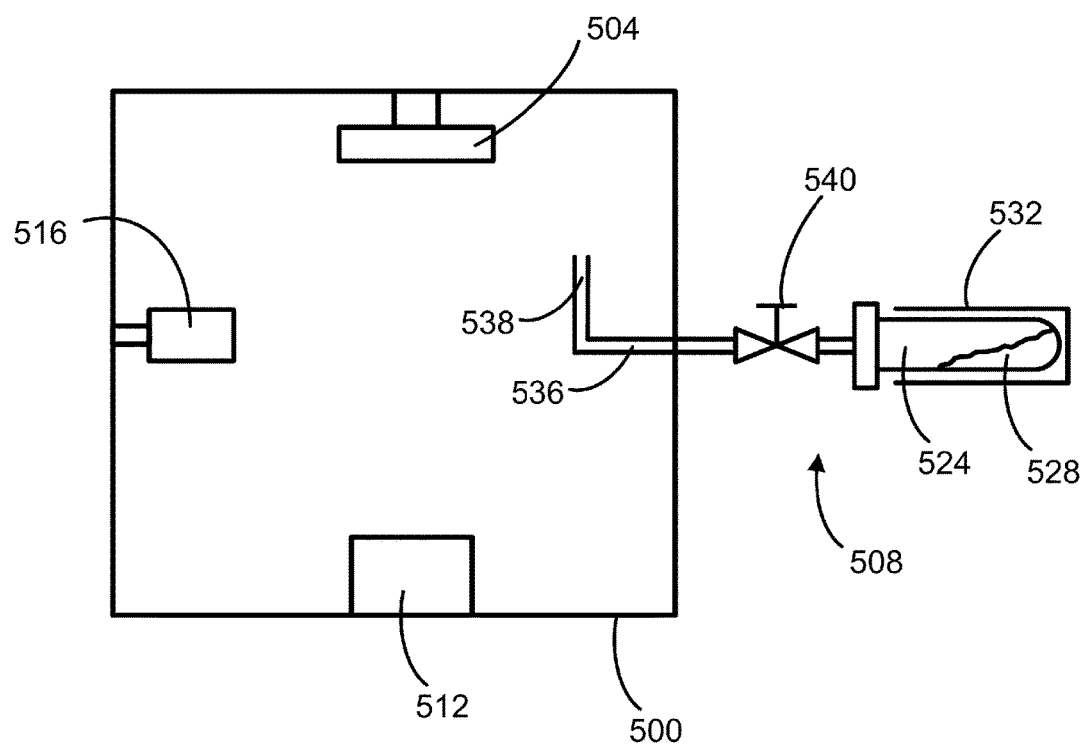

[Fig. 6]
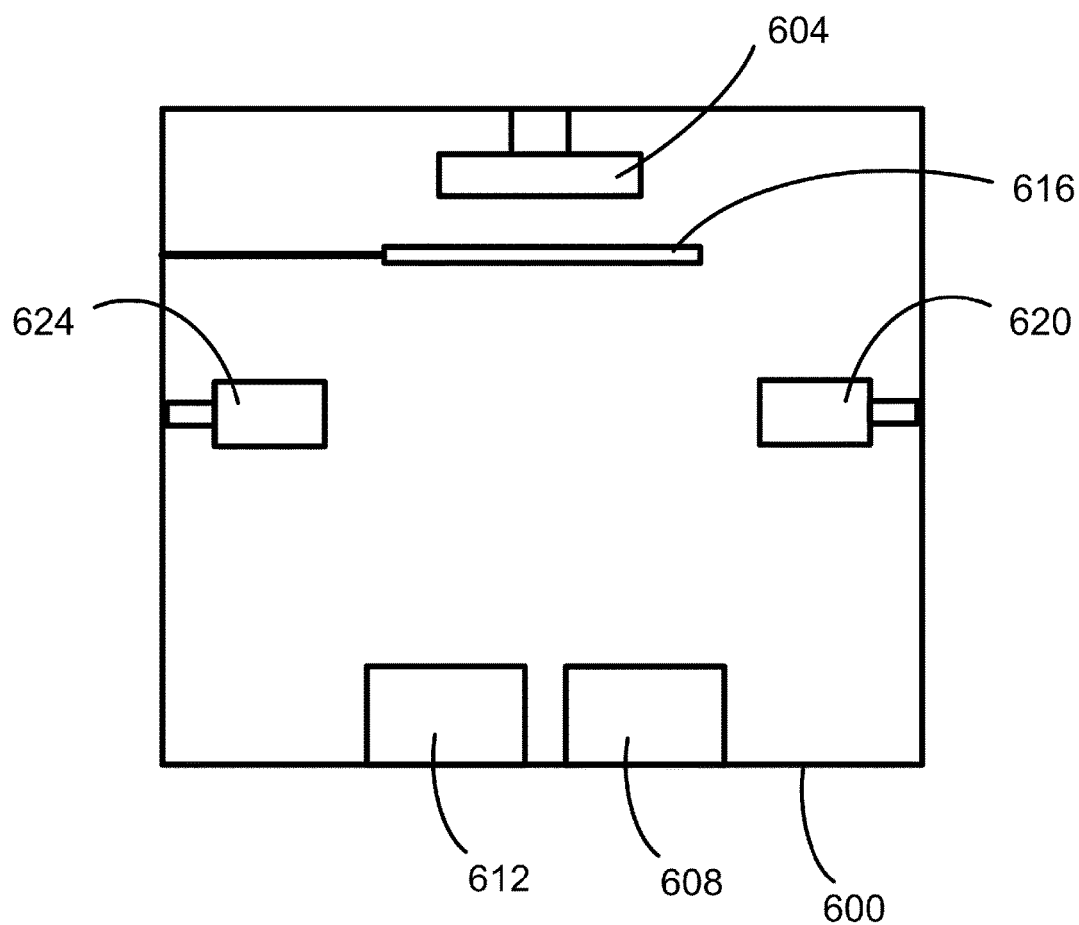

[Fig. 7]
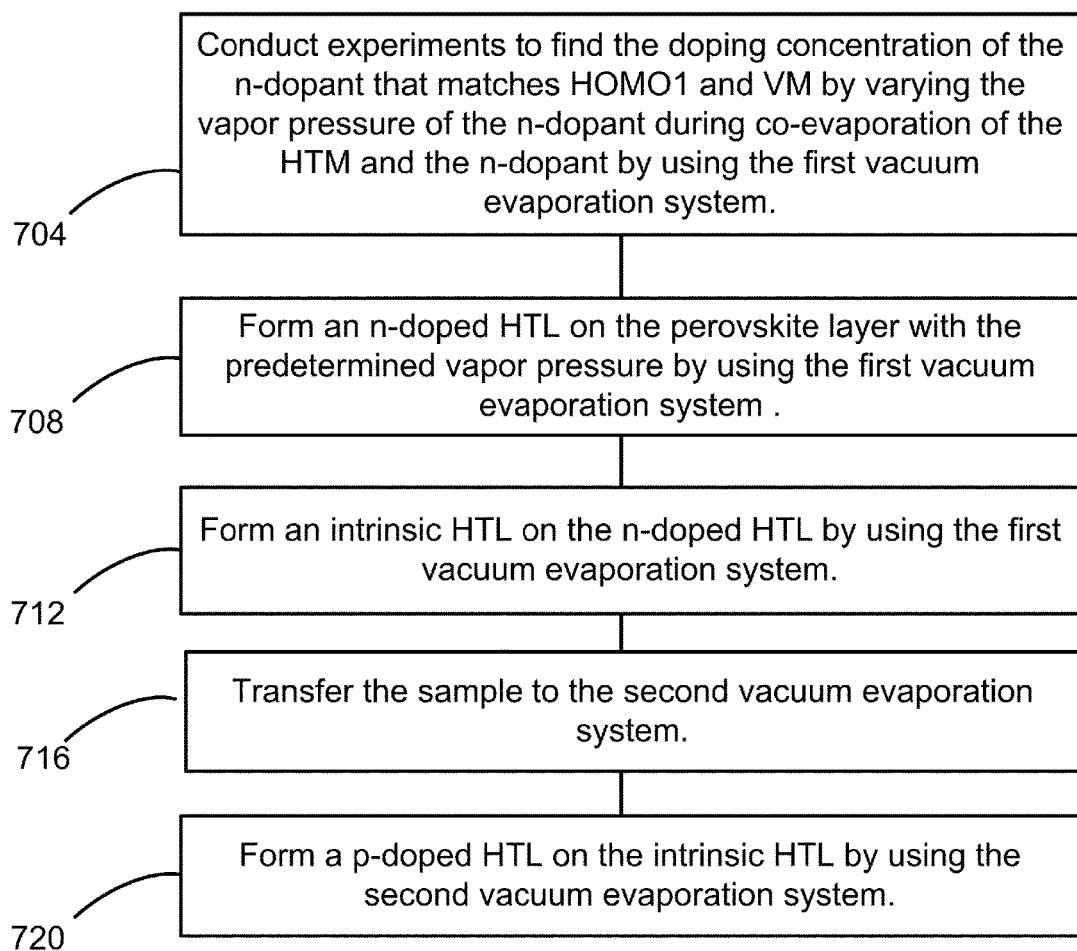

[Fig. 8]
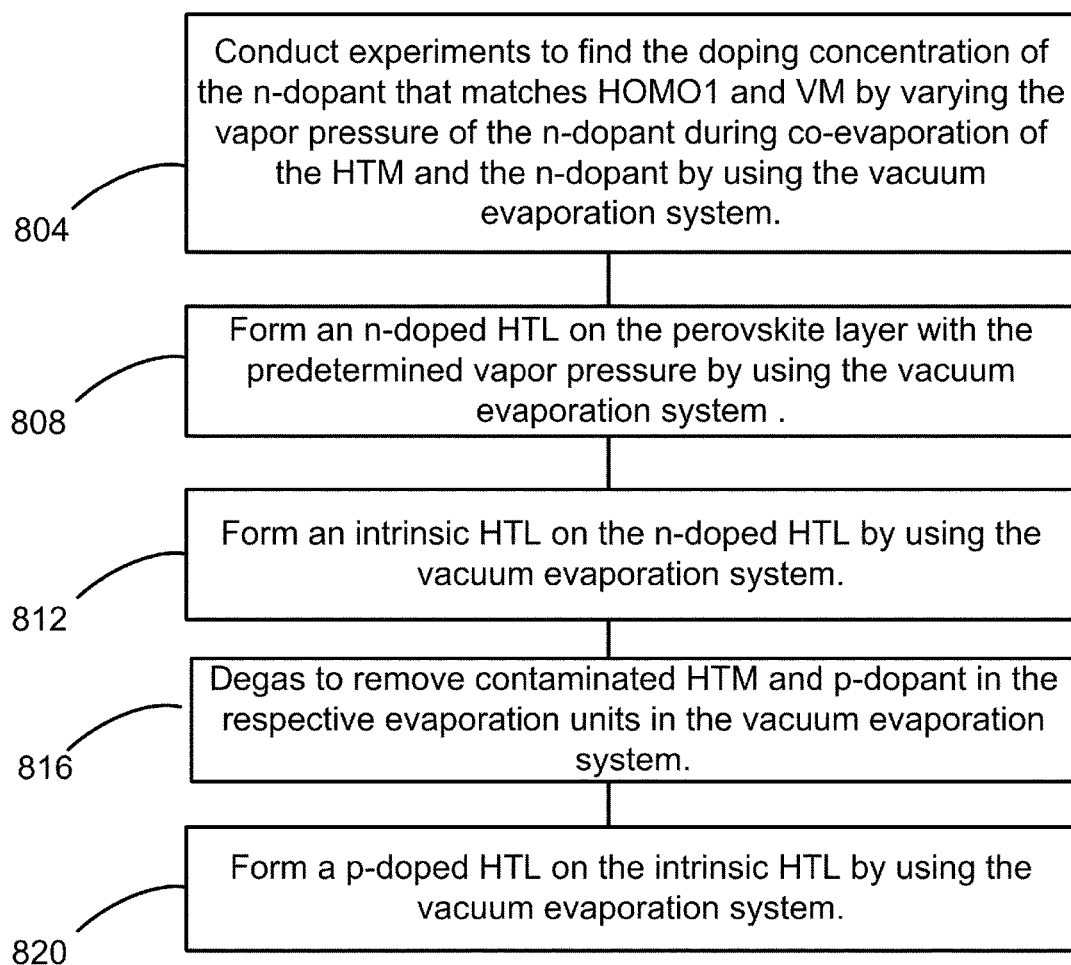

[Fig. 9]
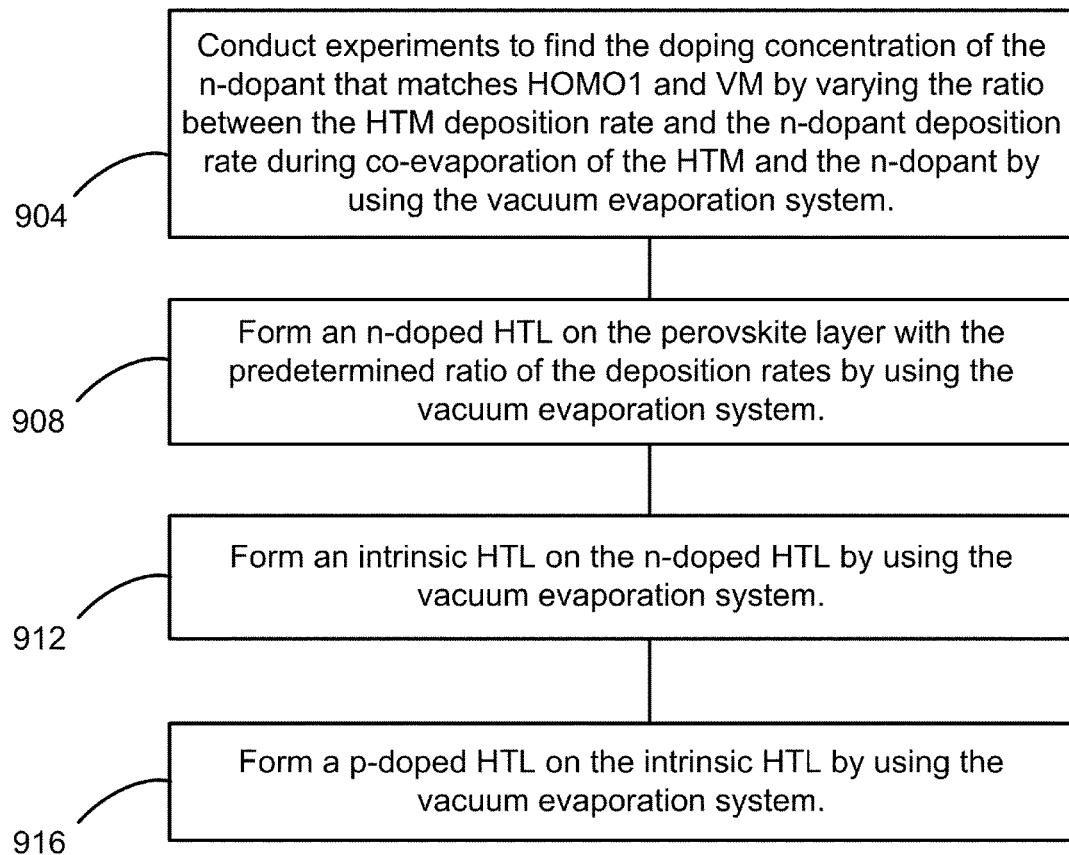

DOPING ENGINEERED HOLE TRANSPORT LAYER FOR PEROVSKITE-BASED DEVICE

TECHNICAL FIELD

The present invention relates to doping engineered hole transport layers for perovskite-based devices for optoelectronics applications.

BACKGROUND ART

A solar cell (also called a photovoltaic cell) is an electrical device that converts solar energy into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, $CH_3NH_3PbX_3$ and $CH_3NH_3SnX_3$, where X=Cl, Br, I or a combination thereof, for example, have recently emerged as a promising material for the next generation of high efficiency, low cost solar technology. It has been reported that these synthetic perovskites can exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, etc.

Recent reports have indicated that this class of materials, i.e., organometal halide perovskites, have potential for high-performance semiconducting media in other optoelectronic devices as well. In particular, some perovskites are known to exhibit strong photoluminescence properties, making them attractive candidates for use in light-emitting diodes (LEDs). Additionally, it has been reported that perovskites also exhibit coherent light emission properties, hence optical amplification properties, suitable for use in electrically driven lasers. In these devices, electron and hole carriers are injected into the photoluminescence media, whereas carrier extraction is needed in solar cell devices.

However, to date, it has been difficult to obtain stable perovskite-based devices using existing fabrication techniques. Furthermore, these existing techniques are not robust enough for fabricating perovskite-based devices with doping engineered layers, multi-junction or Tandem cell structure, heterostructure construction, or other advanced optoelectronic structures. In view of ever increasing needs for low cost fabrication techniques of high-performance devices, a new fabrication technique is desired for producing stable and highly efficient perovskite-based devices suitable for solar cells and other optoelectronics applications including LEDs and lasers.

CITATION LIST

Patent Literature

PTL 1: Forrest et al., U.S. Pat. No. 7,683,536
PTL 2: Adamovich et al., U.S. Pat. No. 8,778,511
PTL 3: Qi et al., International Application No. PCT/JP2015/002041
PTL 4: Qi et al, International Application No. PCT/JP2015/003450

Non Patent Literature

NPL 1: Guichuan Xing et al., Low-temperature solution-processed wavelength-tunable perovskites for lasing. Nature Materials Vol. 13, 476-480 (March, 2014).
NPL 2: Zhi-Kuan Tan et al., Bright light-emitting diodes based on organometal halide perovskite. Nature Nanotechnology Vol. 9, 687-692 (September, 2014).
NPL 3: Giles E. Eperon et al., Formamidinium lead trihalide: a broadly tunable perovskite for efficient planar heterojunction solar cells. Energy Environ. Sci. 7, 982-988 (2014).
NPL 4: Mingzhen Liu et al., Efficient planar heterojunction perovskite solar cells by vapour deposition. Nature Vol. 501, 395-398 (2013).
NPL 5: Julian Burschka et al., Sequential deposition as a route to high-performance perovskite-sensitized solar cells. Nature Vol. 499, 316-320 (July, 2013).
NPL 6: Zafer Hawash et al., Air-exposure induced dopant redistribution and energy level shifts in spin-coated spiro-MeOTAD films. Chem. Mater. 27, 562-569 (2015).
NPL 7: Luis K. Ono et al., Air-exposure-induced gas-molecule incorporation into spiro-MeOTAD films. J. Phys. Chem. Lett. 5, 1374-1379 (2014).
NPL 8: Calvin K. Chan et al., Incorporation of cobaltocene as an n-dopant in organic molecular films. J. Appl. Phys. 102, 014906 (2007).
NPL 9: Calvin K. Chan et al., Molecular n-type doping of 1,4,5,8-naphthalene tetracarboxylic dianhydride by pyronin B studied using direct and inverse photo-electron spectroscopies. Adv. Funct. Mater. 16, 831-837 (2006).
NPL 10: Jens Meyer et al., Transition metal oxides for organic electronics: Energetics, Device Physics and Applications. Adv. Mater. 24, 5408-5427 (2012).
NPL 11: Yabing Qi et al., Solution doping of organic semiconductors using air-stable n-dopants. Appl. Phys. Lett. 100, 083305 (2012).
NPL 12: Yabing Qi et al., Use of a high electron-affinity molybdenum dithiolene complex to p-dope hole-transport layers. J. Am. Chem. Soc. 131, 12530-12531 (2009).
NPL 13: Calvin K. Chan et al., Decamethylcobaltocene as an efficient n-dopant in organic electronic materials and devices. Organic Electronics 9, 575-581 (2008).
NPL 14: Weiyng Gao et al., Controlled p doping of the hole-transport molecular material N,N'-diphenyl-N,N'-bis.1-naphthyl.-1,1'-biphenyl-4,4'-diamine with tetrafluorotetracyanoquinodimethane. J. Appl. Phys. 94, 359-366 (2003).
NPL 15: Yixin Zhao et al., Effective hole extraction using MoOx-Al contact in perovskite CH3NH3PbI3 solar cells. Appl. Phys. Lett. 104, 213906 (2014).

SUMMARY

An optoelectronic device is provided, the device comprising an active layer comprising organometal halide perovskite and a hole transport layer (HTL) formed by vacuum evaporation and configured to transport hole carriers. The HTL includes a first sublayer comprising a hole transport material (HTM) doped with an n-dopant and disposed adjacent to the active layer, a second sublayer comprising the HTM that is undoped and disposed adjacent to the first sublayer, and a third sublayer comprising the HTM doped with a p-dopant and disposed adjacent to the second sublayer. The doping concentration of the n-dopant for the n-doped sublayer is determined to match the highest occupied molecular orbital energy level of the n-doped sublayer with the valence band maximum energy level of the perovskite active layer.

BRIEF DESCRIPTION OF DRAWINGS

FIG. 2 illustrates an energy diagram of a perovskite-based device, having an active layer comprising perovskite and an HTL comprising three sublayers of an ndoped HTL, an intrinsic HTL and a p-doped HTL.

FIG. 3 shows plots of current density j versus voltage V of perovskite solar cells fabricated with four different HTLs, respectively.

FIG. 4 is a flowchart illustrating a fabrication process of a perovskite-based device including the n-i-p structured HTL. 3

FIG. 5 schematically illustrates an example of the vacuum evaporation system (not to scale) for co-evaporating two or more source materials.

FIG. 6 schematically illustrates another example of the vacuum evaporation system (not to scale) for co-evaporating two or more source materials.

FIG. 7 is a flowchart illustrating an example process for fabricating the n-i-p structured HTL on the perovskite active layer for the case of using a volatile n-dopant and a non-volatile p-dopant.

FIG. 8 is a flowchart illustrating an example process using one system for fabricating the n-i-p structured HTL on the perovskite active layer for the case of using a volatile n-dopant and a non-volatile p-dopant.

FIG. 9 is a flowchart illustrating an example process using one system for fabricating the n-i-p structured HTL on the perovskite active layer for the case of using a non-volatile n-dopant and a non-volatile p-dopant.

DESCRIPTION OF EMBODIMENTS

Figure 1A:
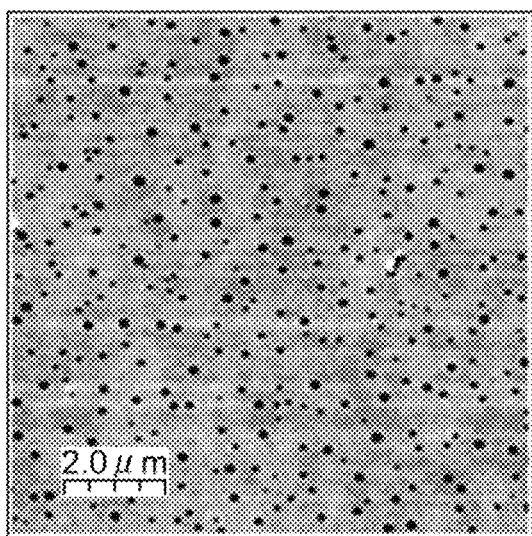
FIGS. 1A-1B show photos of the tapping-mode atomic force microscopy (AFM) images of the solution-based spin-coated spiro-OMeTAD with tBP and Li-salt and the p-doped spiro-OMeTAD fabricated by vacuum evaporation, respectively.

Source materials for fabricating an organometal halide perovskite film include halide materials such as $PbCl_2$, $PbBr_2$, $Pb_2$, $SnCl_2$, $SnBr_2$, $SnI_2$ and the like, and methylammonium (MA=$CH_3NH_3^+$) compounds such as $CH_3NH_3Cl$, $CH_3NH_3Br$, $CH_3NH_3I$, and the like. In place of, or in a combination with the MA compound, a formamidinium (FA=$HC(NH_2)_2^+$) compound can also be used. Organometal halide perovskites have the orthorhombic structure generally expressed as $ABX_3$, in which an organic element, MA or FA, occupies each site A; a metal element, $Pb^{2+}$ or $Sn^{2+}$, occupies each site B; and a halogen element, $Cl^-$, $I^-$ or $Br^-$, occupies each site X. In this document, AX represents an organic halide compound having an organic element MA or FA for the A-cation combined with a halogen element Cl, I or Br for the X-anion; $BX_2$ represents a metal halide compound having a metal element Pb or Sn for the B-cation combined with a halogen element Cl, I or Br for the X-anion. Here, the actual element X in the AX and the actual element X in the $BX_2$ can be the same or different, as long as each is selected from the halogen group. For example, X in the AX can be Cl, while X in the $BX_2$ can be Cl, I or Br. Accordingly, formation of a mixed perovskite, e.g., $MAPbI_{3-x}Cl_x$, is possible.

Organometal halide perovskite can be used for an active layer in an optoelectronic device, such as a solar cell, LED, laser, etc. Here, the "active layer" refers to a layer where the conversion of photons to charge carriers (electrons and holes) occurs in a photovoltaic device; for a photo-luminescent device, it refers to a layer where charge carriers are combined to generate photons. A hole transport layer (HTL) can be used as a medium for transporting hole carriers from the active layer to an electrode in a photovoltaic device; for a photo-luminescent device, the HTL refers to a medium for transporting hole carriers from an electrode to the active layer. A solution method is typically employed to form an HTL for a perovskite-based device. For example, the solution of 2,2',7,7'-tetrakis(N,N'-di-p-methoxyphenylamine)-9,9'-spirobifluorene (spiro-OMeTAD, also called spiro-MeO-TAD) with 4-tert-butylpiridine (tBP) and lithium bis-(trifluoromethylsulfonyl)imide salt (Li-salt) may be spin-coated to form the HTL on a perovskite film. However, a recent study described in NPL6 (Hawash et al., incorporated herein by reference) reveals that these solution-processed films made of spiro-OMeTAD typically include pinholes with a high density. Here, a pinhole is defined as a defect having a shape of a hole with a small diameter penetrating substantially vertically through the film. These pinholes may penetrate through the entire thickness of the film or deeply into the film starting from the film surface. These pinholes in the HTL can cause instability of perovskite-based devices, via shortening or mixing between layers, which is likely the reason why a typical perovskite solar cell using a solution-processed spiro-OMeTAD film for the HTL shows rapidly reduced efficiency when exposed to air. These pinholes are also likely the cause for the very short lifetime of typical perovskite solar cells, which use solution-processed spiro-OMeTAD for the HTL. The effects are considered to be twofold: (i) pinholes facilitate moisture migration through the HTL to reach and degrade the perovskite; (ii) pinholes facilitate component elements, e.g., iodine, from the perovskite to migrate to the top surface and degrade or decompose the perovskite. Based on such observations, it is noted that the preparation procedure of spiro-OMeTAD for use as the HTL be optimized to avoid pinhole formation, thereby to increase the lifetime of perovskite solar cells.

Figure 1B:
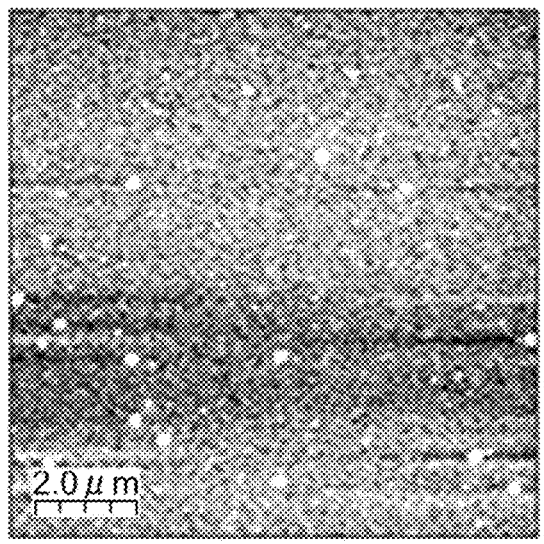

Another study described in NPL7 (Ono et al., incorporated herein by reference) reveals that spiro-OMeTAD films prepared by vacuum evaporation include a significantly less number of pinholes than the solution-processed spiro- OMeTAD films. FIGS. 1A-1B show photos of the tapping-mode atomic force microscopy (AFM) images of the solution-based spin-coated spiro-OMeTAD with tBP and Li-salt and the p-doped spiro-OMeTAD fabricated by vacuum evaporation, respectively. Tetrafluorotetracyanoquinodimethane (F4-TCNQ) is used for the p-dopant in FIG. 1B, and the scan range is 10×10 μm² in both photos. The diameter of a pinhole is approximately 135 nm on average, and the pinhole density is about 3.72/μm² in the photo of FIG. 1A. The white spots seen in the photo of FIG. 1B are considered to be aggregates induced by the p-dopant. The size and density of these aggregates depend on doping concentration. It is observed that the overall smooth film morphology is achieved in the HTL in FIG. 1B fabricated by vacuum evaporation. Accordingly, vacuum evaporation is considered to be suitable for obtaining pinhole-free spiro-OMeTAD films. Here the term "pinhole-free" is used to represent a significantly less number of pinholes than normally present in a solution-processed spiro-OMeTAD film. However, it is also noted that when an intrinsic spiro-OMeTAD layer (i.e., undoped or not intentionally-doped) and/or a p-doped spiro-OMeTAD layer is grown on a perovskite film by vacuum evaporation to be used as the HTL for a solar cell device, the power conversion efficiency (PCE) becomes low, possibly due to inefficient hole extraction, resulting in low conductivity.

In general, electrical or chemical doping is an efficient means for improving and con-trolling charge injection/extraction and carrier transport in photovoltaic and other optoelectronic devices. Doping engineering can be utilized to increase the carrier density and generate space-charge layers at interfaces, resulting in an increase in effective charge mobility, hence conductivity.

In this document, perovskite solar cells are fabricated by implementing an HTL comprising a triple-layer of n-type doped, intrinsic and p-type doped hole transport material (HTM). The n-dopant and the p-dopant for typical use are decamethylcobaltocene (DMC) and tetrafluorotetracyanoquinodimethane (F4-TCNQ), respectively. Other types of n-dopants, p-dopants and HTMs can be considered for doping engineering to enhance the carrier mobility, hence the film conductivity, for solar cells, LEDs, lasers and other perovskite-based optoelectronic devices. Examples of n-dopants include but not limited to: DMC, Pyronin B, cobaltocene ($CoCp_2$), rhodocene ($[RhCp_2]_2$) and ruthenium (pentamethylcyclopentdienyl) (1,3,5-triethylbenzene) ($[Cp*Ru(TEB)]_2$). Examples of p-dopants include but not limited to: F4-TCNQ, transition metal oxides such as molybdenum tri-oxide ($MoO_3$), vanadium pent-oxide ($V_2O_5$) or tungsten tri-oxide ($WO_3$), and molybdenum tris[1,2-bis(trifluoromethyl-)ethane-1,2-dithiolene] ($Mo(tfd)_3$). Examples of HTMs include but not limited to: spiro-OMeTAD, poly(3-hexylthiophene-2,5-diyl) (P3HT), poly(triaryl amine) (PTAA), graphene oxide, nickel oxide, poly(3,4-ethylenedioxythiophene) polystyrene sulfonate (PEDOT:PSS), copper thiocyanate (CuSCN), CuI, $Cs_2SnI_6$, alpha-NPD, $Cu_2O$, CuO, subphthalocyanine, 6,13-bis (triisopropylsilylethynyl) pentacene (TIPS-pentacene), PCP-DTBT, PCDTBT, OMeTPA-FA, OMeTPA-TPA, and quinolizino acridine.

FIG. 2 illustrates an energy diagram of a perovskite-based device, having an active layer comprising perovskite and an HTL comprising three sublayers of an n-doped HTL, an intrinsic HTL and a p-doped HTL. In the structure illustrated in FIG. 2, the n-doped HTL is a first sublayer comprising an n-type doped HTM disposed adjacent to the perovskite active layer, the intrinsic HTL is a second sublayer comprising an intrinsic (i.e., undoped or not intentionally doped) HTM disposed adjacent to the first sublayer, and the p-doped HTL is a third sublayer comprising a p-type doped HTM disposed adjacent to the second sublayer. A metal electrode is formed on the p-doped HTL, defining the Fermi energy level EF. The energy level of highest occupied molecular orbital (HOMO) for each layer can be measured by using ultra-violet photo-electron spectroscopy (UPS), and labeled HOMO1 for the n-doped HTL, HOMO2 for the intrinsic HTL, and HOMO3 for the p-doped HTL in FIG. 2. On the basis of energetics studies, it is possible to determine the n-type doping concentration that is optimal for matching the HOMO1 level with the top of the valence band of the perovskite layer, i.e., the valence band maximum energy level, labeled VM in FIG. 2. Specifically, the n-doped HTL with a proper level of doping concentration can cause the Fermi energy level in the n-doped HTL to shift toward the lowest unoccupied molecular orbital (LUMO) of the n-doped HTL so that the HOMO1 level of the n-doped HTL can match with the valence band maximum of the perovskite layer, which is adjacent to the n-doped HTL. Here, the HOMO1 and the VM are considered to be matched when the HOMO1 with respect to the VM is in the range of −0.1 eV~0.3 eV, while 0 eV in this range corresponds to exactly the same energy level. When the HOMO1 is higher than the VM, there is no energy barrier for holes to flow from the valence band of the perovskite layer to the HOMO1 of the n-doped HTL. However, it has been observed that the open circuit voltage ($V_{oc}$) of the solar cell typically decreases as the energy difference between the HOMO1 and VM increases. Accordingly, the upper limit of 0.3 eV is empirically set to keep the $V_{oc}$, in an optimal range. On the other hand, when the HOMO1 is lower than the VM, there is an energy barrier for holes. The lower limit of −0.1 eV, i.e., the HOMO1 being lower than the VM by 0.1 eV, is set based on experiments, such as UPS. These experiments provide information that within a small energy gap away from the HOMO1, e.g., 0.1 eV away, and into the gap between the HOMO1 and the LUMO, there are a reduced density of (but non-zero) states that enable holes to flow from the valence band of the perovskite layer to the HOMO1 level of the n-doped HTL.

FIG. 3 show plots of current density j versus voltage V of perovskite solar cells fabricated with four different HTLs, respectively. The plot A represents j vs. V for the case of having the HTL comprising solution-processed spiro-OMeTAD with tBP and Li-salt; the plot B for the case of having the HTL comprising three sublayers of DMC doped spiro-OMeTAD, intrinsic spiro-OMeTAD, and F4-TCNQ doped spiro-OMeTAD; the plot C for the case of having the HTL comprising a layer of F4-TCNQ doped spiro-OMeTAD only; and the plot D for the case of having the HTL comprising a layer of intrinsic spiro-OMeTAD only. The HTL in A is formed based on a solution method; while the HTLs in B, C and D are grown by vacuum evaporation. Table 1 lists open circuit voltage $V_{oc}$, short circuit current density $j_{sc}$, fill factor FF, and power conversion efficiency PCE associated with the four plots A, B, C, and D. It should be noted that p-doping alone does not lead to significant improvement in conductivity and efficiency, as evidenced by the plot C. On the other hand, conductivity and efficiency are significantly improved, reaching the PCE of almost 9%, in the case of having the HTL comprising the n-i-p structured sublayers, as evidenced by the plot B. It should be noted also that $V_{oc}$, is significantly lower in the sample C (with the p-doped HTL only) than in the sample B (with the n-i-p structured HTL).

TABLE 1

|   | $V_{OC}$(V) | $j_{sc}$(mA/cm$^2$) | FF (%) | PCE (%) |
| --- | --- | --- | --- | --- |
| A (solution-processed) | 0.967 | 23.1 | 60.3 | 13.5 |
| B (n-i-p) | 0.819 | 19.4 | 55.7 | 8.9 |
| C (p only) | 0.651 | 16.5 | 54.7 | 5.9 |
| D (i only) | 0.662 | 5.2 | 19.9 | 0.7 |

FIG. 4 is a flowchart illustrating a fabrication process of a perovskite-based device including the n-i-p structured HTL. First, in step 404, a perovskite layer is formed as the active layer on a substrate. Examples of substrate materials include: fluorine-dope tin oxide (FTO) glass with or without an electron transport layer (ETL) formed thereon. Examples of ETL materials include TiO$_2$, ZnO and phenyl-C$_{61}$-butyric acid methyl ester (PCBM). A flexible polymer such as polyethylene terephthalate may be used as the base material instead of a glass. Additionally, a thin wetting layer comprising PbCl$_2$ or PbI$_2$, for example, can be added to any of the above substrate for enhancing the quality of a subsequently grown perovskite film. As mentioned earlier, a wide variety of organic source materials AX and halide source materials BX$_2$ are available to form a perovskite film ABX$_3$. The perovskite film can be grown on the substrate by using any of the solution methods, vacuum evaporation methods, chemical vapor deposition (CVD) methods and other fabrication methods.

In step 408, an n-doped HTL comprising an n-type doped HTM is formed on the perovskite layer by co-evaporating the HTM and the n-dopant using a vacuum evaporation system. After a predetermined thickness of the n-doped HTL has been reached, in step 412, an intrinsic HTL is formed on the n-doped HTL by vacuum evaporation. For example, to carry out this step, the evaporation of the HTM is continued in the same chamber, while the evaporation of the n-dopant material is discontinued. The intrinsic HTL plays a role in minimizing inter-diffusion between the n-type and p-type dopants from the respective sublayers in the resultant film. In step 416, a p-doped HTL comprising a p-type doped HTM is formed on the intrinsic HTL by co-evaporating the HTM and the p-dopant by vacuum evaporation. As explained later, this step of forming the p-doped HTL may be carried out using the same or a different vacuum evaporation system that was used for step 408 of forming the n-doped HTL. After a predetermined thickness of the p-doped HTL has been reached, in step 420, an electrode is formed on the p-doped HTL by thermal evaporation. The electrode can be metal contacts made of Au, Ag or Al, for example. A bell jar evaporator, for example, may be used to deposit the thick metal layer, which generally requires a large amount of the source metal and high power during deposition.

Fabrication of the n-i-p structured HTL on a perovskite active layer may be carried out by using one or more vacuum evaporation systems that are similar to or variations of the systems described in PTL3 (PCT/JP2015/002041) and PTL4 (PCT/JP2015/003450), the disclosures of which are incorporated herein by reference.

FIG. 5 schematically illustrates an example of the vacuum evaporation system (not to scale) for co-evaporating two or more source materials. This system includes a chamber 500 coupled to necessary parts. A pump unit (not shown) is coupled to the chamber 500 for generating near vacuum in the chamber 500 for the deposition process. A substrate stage 504 is coupled to the top section of the chamber 500 and configured to have a stage surface facing downward for a substrate or a base film to be staged facing downward. The temperature of the substrate stage 504 can be controlled to provide uniform cooling or heating to the substrate or the base film. In the system of FIG. 5, a first evaporation unit 508 is coupled to the side section of the chamber 500, and is configured for generating the vapor of a dopant material in the chamber 500. Furthermore, a second evaporation unit 512 is coupled to the bottom section of the chamber 500, and is configured for generating the vapor of an HTM in the chamber 500. The second evaporation unit 512 may be configured to include a crucible to contain the HTM, which can be heated to generate the HTM vapor. In the system of FIG. 5, a monitor 516, e.g., a quartz crystal microbalance, is provided to monitor the deposition rate of the HTM. One first evaporation unit 508 for the dopant is illustrated in FIG. 5; however, two or more first evaporation units may be coupled to the side section of the chamber 500, depending on the type and number of dopants.

As an example, the first evaporation unit 508 in FIG. 5 is illustrated to include an ampule 524 to contain the powder of the dopant material 528, and a heating element 532 is provided to heat the ampule 524, hence the powder 528, to generate its vapor. The temperature of the heating element 532 is controlled to adjust the evaporation rate of the dopant material 528. The first evaporation unit 508 illustrated in FIG. 5 further includes a duct 536 to guide the vapor flux into the chamber 500, and can be positioned at an angle with respect to the internal side surface of the chamber 500, wherein the angle can be predetermined so that the vapor is outputted efficiently into the chamber 500. Alternatively or additionally, the duct 536 may be configured to have an extending section 538 to output the vapor in a desired direction in the chamber 500. The duct 536 is coupled to a valve 540, e.g., a precision leak valve, for adjusting the vapor flow in a simple but timely manner. Thus, the valve 540 can be used to effectively control the vapor pressure of the dopant in the chamber 500, hence the doping concentration in the resultant film.

The system configuration, as illustrated in FIG. 5, having the first evaporation unit 508 coupled to the side section of the chamber 500 allows for the vapor flow of the dopant material to circulate to fill the chamber 500 effectively, thereby facilitating efficient and uniform doping. The use of an ampule coupled with a valve for the first evaporation unit 508 is especially suited for a volatile dopant material, not only because this configuration allows for uniform and efficient circulation of the volatile dopant vapor to fill the chamber 500, but also because the vapor pressure of the dopant in the chamber 500 can be simply and swiftly controlled by the valve 540.

FIG. 6 schematically illustrates another example of the vacuum evaporation system (not to scale) for co-evaporating two or more source materials. This system includes a chamber 600 coupled to necessary parts. A pump unit (not shown) is coupled to the chamber 600 for generating near vacuum in the chamber 600 for the deposition process. A substrate stage 604 is coupled to the top section of the chamber 600 and configured to have a stage surface facing downward for a substrate or a base film to be staged facing downward. The temperature of the substrate stage 604 can be controlled to provide uniform cooling or heating to the substrate or the base film. Additionally, the substrate stage 604 may be configured to be rotatable; uniformity of the deposited film can be enhanced by rotating the substrate stage 604 during co-evaporation. In the system of FIG. 6, a first evaporation unit 608 and a second evaporation unit 612 are coupled to the bottom section of the chamber 600, and are configured for generating the vapors of the dopant material and the HTM, respectively. Each of the first and second evaporation units 608 and 612 may be configured to include a crucible to contain the source material in the form of powder, which can be heated to generate its vapor. The substrate stage 604 may not have to be rotated during the co-evaporation, if the substrate stage 604 and the evaporation units 608 and 612 are separated along a vertical distance sufficiently long enough to ensure uniform deposition of the vapors of the two source materials. A shield may be provided between the first evaporation unit 608 and the second evaporation unit 612, so as to reduce the thermal interference between the two types of vapors in the proximity of the sources. The present system includes a shutter 616 below the substrate stage 604, and configured to be movable to expose and cover the substrate stage 604. Initially, the substrate stage 604 may be covered by the shutter 616, while the source materials in the first and second evaporation units 608 and 612 are heated until the evaporation rates reach predetermined values, respectively. Thereafter, the shutter 616 can be moved to expose the substrate stage 604 to the deposition. In the system of FIG. 6, a first monitor 620 and a second monitor 624, e.g., a quartz crystal microbalance, are provided to monitor the deposition rates of the dopant and the HTM, respectively. One first evaporation unit 608 for the dopant and one second evaporation unit 612 for the HTM are illustrated in FIG. 6; however, two or more first evaporation units may be coupled to the bottom section of the chamber 600, depending on the type and number of dopants. Correspondingly, three or more monitors may be provided to monitor individual deposition rates of the three or more types of source materials.

F4-TCNQ and many other p-dopants are available in the form of powder. Spiro-OMeTAD and many other small molecule HTMs are available in the form of powder, except for polymeric HTMs, e.g., P3HT and PTAA. DMC and many other n-dopants are available in the form of powder. It is noteworthy that the system configuration including an ampule coupled with a valve, such as the first evaporation unit 508 illustrated in FIG. 5, is compatible with dopants in the liquid or gas form.

As mentioned earlier, the use of an ampule coupled with a valve for the first evaporation unit 508 is especially suited for a volatile dopant material, not only because this configuration allows for uniform and efficient circulation of the volatile dopant vapor to fill the chamber 500, but also because the vapor pressure of the dopant in the chamber 500 can be simply and swiftly controlled by the valve 540 of the first evaporation unit 508. The vapor pressure of a volatile n-dopant can be varied using this configuration to find the doping concentration that can match the HOMO level of the n-doped HTL, HOMO1, to the valence band maximum of the perovskite, VM, as labeled in FIG. 2. Here, the HOMO1 and the VM are considered to be matched when the energy level difference is small enough to extract photoexcited hole carriers from the perovskite active layer to the n-doped HTL. As mentioned earlier, such a matching tolerance of the HOMO1 with respect to the VM may be set to be in the range of −0.1 eV~0.3 eV, while 0 eV in this range corresponds to exactly the same energy level. The optimal value of vapor pressure of the n-dopant may be predetermined based on experiments, such as UPS measurements, prior to the fabrication. For example, after the formation of the perovskite layer, one batch of the samples may be used for the experiments to find the optimal vapor pressure, hence the doping concentration, of the volatile n-dopant for forming the n-doped HTL with the proper HOMO1 energy level.

On the other hand, when the n-dopant is non-volatile, an evaporation unit such as a crucible coupled to the bottom section of the chamber 600 may be used to generate the vapor of the non-volatile n-dopant. In this case, the doping concentration that matches the HOMO1 and VM energy levels may be found by varying the ratio between the HTM deposition rate and the n-dopant deposition rate. Monitoring of individual deposition rates are enabled by using the second vacuum evaporation system, such as the example in FIG. 6, including three monitors for the HTM, the n-dopant and the p-dopant, respectively.

The first example of the vacuum evaporation system illustrated in FIG. 5, a first vacuum evaporation system, is suitable for use when the dopant material is volatile, e.g., n-type dopant DMC. The second example of the vacuum evaporation system illustrated in FIG. 6, a second vacuum evaporation system, is suitable for use when the dopant material is non-volatile, e.g., p-type dopant F4-TCNQ. FIG. 7 is a flowchart illustrating an example process for fabricating the n-i-p structured HTL on the perovskite active layer for the case of using a volatile n-dopant and a non-volatile p-dopant. In step 704, experiments are conducted on a batch of samples to find the doping concentration of the n-dopant that matches the HOMO1 and VM levels by varying the vapor pressure of the n-dopant during co-evaporation of the HTM and the n-dopant by using the first vacuum evaporation system. In this first system, such as illustrated in FIG. 5, the first evaporation unit 508 coupled to the side section of the chamber 500 is used for generating the vapor of the n-dopant, and the second evaporation unit 512 coupled to the bottom section of the chamber 500 is used for generating the vapor of the HTM. In step 708, forming an n-doped HTL on the perovskite layer is carried out with the predetermined vapor pressure by using the first vacuum evaporation system. Thereafter, in step 712, forming the intrinsic HTL on the n-doped HTL is carried out in the same first vacuum evaporation system by continuing the evaporation of the HTM, while discontinuing the evaporation of the n-dopant material. Thereafter, in step 716, the sample including the n-doped HTL and the intrinsic HTL is transferred to the second vacuum evaporation system, such as illustrated in FIG. 6, and placed on the substrate stage 604. Thereafter, in step 720, forming a p-doped HTL on the intrinsic HTL is carried out in the second vacuum evaporation system by using the first and second evaporation units 608 and 612, both coupled to the bottom section of the chamber 600, for generating the vapors of the non-volatile p-dopant and the HTM, respectively.

In the above process, the sample is transferred from the first system to the second system after forming the intrinsic HTL in 712. Alternatively, it is possible to transfer the sample after forming the n-doped HTL in 708 before forming the intrinsic HTL in 712. In this case, the intrinsic HTL is formed in the second system by evaporating the HTM only. Thereafter, the co-evaporation of the HTM and the p-dopant can be carried out to form the p-doped HTL on the intrinsic HTL in the second system.

Alternative to the two-system process above, one system that is a combination of the first and second systems can be used for the sequential deposition of n-i-p layers for the case of using a volatile n-dopant and a non-volatile p-dopant. For example, this vacuum evaporation system may include an evaporation unit coupled to the side section of the chamber, such as 508 in FIG. 5, for generating the vapor of the volatile n-dopant material, and two evaporation units coupled to the bottom section of the chamber, such as 608 and 612 in FIG. 6, for generating the vapors of the p-dopant material and the HTM, respectively. FIG. 8 is a flowchart illustrating an example process using one system for fabricating the n-i-p structured HTL on the perovskite active layer for the case of using a volatile n-dopant and a non-volatile p-dopant. In step 804, experiments are conducted on a batch of samples to find the doping concentration of the n-dopant that matches the HOMO1 and VM levels by varying the vapor pressure of the n-dopant during co-evaporation of the HTM and the n-dopant by using the vacuum evaporation system. In step 808, forming an n-doped HTL on the perovskite layer is carried out with the predetermined vapor pressure by using the vacuum evaporation system. Thereafter, in step 812, forming an intrinsic HTL on the n-doped HTL is carried out in the same vacuum evaporation system by continuing the evaporation of the HTM, while discontinuing the evaporation of the n-dopant material. Since the vapor of the volatile n-dopant circulates and fills the chamber during the formation of the n-doped HTL in step 808, the n-dopant molecules may have contaminated the HTM and the p-dopant material in the evaporation units situated at the bottom of the same chamber, and may even react with the p-dopant. To avoid or minimize source material degradation during the n-type doping, in step 816, thorough degassing is carried out to remove the contaminated HTM and p-dopant material in the respective evaporation units in the vacuum evaporation system before starting the deposition of the HTM and the p-dopant for forming the p-doped HTL. Alternatively, this degassing procedure may be carried out before starting the deposition of the HTM for forming the intrinsic HTL in step 812. Thereafter, in step 820, forming a p-doped HTL on the intrinsic HTL is carried out by using the vacuum evaporation system.

When both the n- and p-dopants are non-volatile, one-system process by using the second system in FIG. 6, for example, can be carried out for the sequential n-i-p deposition. In this case, three evaporation units coupled to the bottom section of the chamber may be configured to generate the vapors of the HTM, the n-dopant material and the p-dopant material, respectively. Monitoring of individual deposition rates are enabled by using the system including three monitors for the HTM, the n-dopant and the p-dopant, respectively. Since both the n- and p-type dopants are non-volatile, neither will significantly contaminate nor react with the other materials contained in the evaporation units situated at the bottom section of the chamber. Thus, no degassing is necessary after the n-dopant evaporation. FIG. 9 is a flowchart illustrating an example process using one system for fabricating the n-i-p structured HTL on the perovskite active layer for the case of using a non-volatile n-dopant and a non-volatile p-dopant. In step 904, experiments are conducted on a batch of samples to find the doping concentration of the n-dopant that matches the HOMO1 and VM levels by varying the ratio between the HTM deposition rate and the n-dopant deposition rate during co-evaporation of the HTM and the n-dopant by using the vacuum evaporation system. Monitoring of the individual deposition rates can be carried out by using the monitors installed for monitoring the respective deposition rates. In step 908, forming an n-doped HTL on the perovskite layer is carried out with the predetermined ratio of the deposition rates by using the vacuum evaporation system. Thereafter, in step 912, forming an intrinsic HTL on the n-doped HTL is carried out in the same vacuum evaporation system by continuing the evaporation of the HTM, while discontinuing the evaporation of the n-dopant material. Thereafter, in step 916, forming a p-doped HTL on the intrinsic HTL is carried out by using the vacuum evaporation system.

When both the n- and p-dopants are volatile, one-system process by using the first vacuum evaporation system in FIG. 5, for example, can be carried out for the sequential n-i-p deposition. In this case, two evaporation units coupled to the side section of the chamber 500 can be configured to generate the vapors of the n-dopant material and the p-dopant material, respectively, while one evaporation unit coupled to the bottom section of the chamber 500 is configured to generate the vapor of the HTM. An ampule coupled with a valve, such as 508 illustrated in FIG. 5, may be used for each of the evaporation units coupled to the side section, thereby avoiding direct contact between the two dopants. Thus, no degassing is necessary after the n-dopant evaporation. Therefore, the one-system process explained earlier with reference to FIG. 8 can be carried out, except that the degassing step in step 816 is omitted.

When the n-dopant is non-volatile and the p-dopant is volatile, one system that is a combination of the first and second systems can be used for the sequential deposition of n-i-p layers. For example, this vacuum evaporation system may include an evaporation unit coupled to the side section of the chamber, such as 508 in FIG. 5, for generating the vapor of the volatile p-dopant material, and two evaporation units coupled to the bottom section of the chamber, such as 608 and 612 in FIG. 6, for generating the vapors of the non-volatile n-dopant material and the HTM, respectively. Since the n-dopant is non-volatile, it will not significantly contaminate nor react with the other materials contained in the evaporation units. Thus, no degassing is necessary after the n-dopant evaporation. Therefore, the one-system process explained earlier with reference to FIG. 9 can be carried out.

Details of the present study and specifics for fabricating the n-i-p structured HTL on the perovskite active layer are explained below.

First, the patterned FTO glass was prepared by HCl and Zn powder and cleaned. On this base material, a 100 nm-thick compact layer of $TiO_2$ was deposited by spray pyrolysis with a precursor solution of acetilacetone, Ti (IV) isopropoxyde and anhydrous ethanol (3:3:2). The substrate was then annealed at 480° C. on a hotplate. The solution method is employed in the present study to fabricate the perovskite $MAPbI_{3-x}Cl_x$ layer, wherein MAI and $PbCl_2$ were dissolved in N,N-dimethylformamide at a 2.5:1 molar ratio with 2.2M MAI and 0.88 M $PbCl_2$. The perovskite solution was spin coated on the substrate at 2000 rpm for 45 sec followed by thermal annealing on the hotplate for 45 min in the glove box (<0.1 ppm $O_2$ and $H_2O$).

To deposit n-type doped spiro-OMeTAD by vacuum evaporation, 5 mg of DMC powder was placed in a glass ampule that is coupled with an all-metal leak valve. The filling of DMC to the ampule was performed in a $N_2$ glovebox to avoid the air exposure. Then the evaporation unit including the ampule containing the DMC powder was installed to the side section of the vacuum chamber, as illustrated in FIG. 5. To evaporate the DMC powder, a heating tape was used to heat the ampule to ~100° C. The base pressure of the vacuum chamber was 1.0×10 Torr. The DMC vapor pressure was varied from $1.0 \times 10^{-6}$ to $5.0 \times 10^{-5}$ Torr to find an optimal DMC doping concentration that can match the HOMO level of the n-type doped spiro-OMeTAD, HOMO1, to the valence band maximum of perovskite, VM. Under the optimal DMC vapor pressure of $1.0 \times 10^{-5}$ Torr, deposition of n-type doped spiro-OMeTAD was carried out with the deposition rate of 0.5 angstrom/s as measured by a quartz crystal microbalance. After the formation of the n-type doped spiro-OMeTAD layer, deposition of intrinsic spiro-OMeTAD was carried out in the same chamber. To form a p-type doped spiro-OMeTAD HTL, the sample was transferred to a second chamber, and co-evaporation of F4-TCNQ (deposition rate=0.1 angstrom/s corresponding to 2 wt. %) and spiro-OMeTAD (deposition rate=0.5 angstrom/s) was performed.

On the basis of atomic force microscopy (AFM) measurement results, the thicknesses of the n-type doped spiro-OMeTAD, intrinsic spiro-OMeTAD, and p-type doped spiro-OMeTAD layers were determined to be approximately 30, 20, and 30 nm, respectively. Lastly, ~60 nm-thick gold contacts were deposited by thermal evaporation. An X-ray diffractometer was used to confirm the crystalline structure of the perovskite layer. UPS measurements were performed in situ on each of the three layers of the n-i-p structured HTL using a He I (21.2 eV) discharging lamp and an energy analyzer with single channeltron. The Fermi edge of a gold film deposited on a highly n-doped Si substrate (0.011~0.015 Ω*cm) was used to determine the EF position and the instrumental resolution.

XRD measurements on the perovskite thin films, $MAPbI_{3-x}Cl_x$, showed typical perovskite (110) and (220) peaks at 14.2° and 28.5°, respectively.

Figure 10:
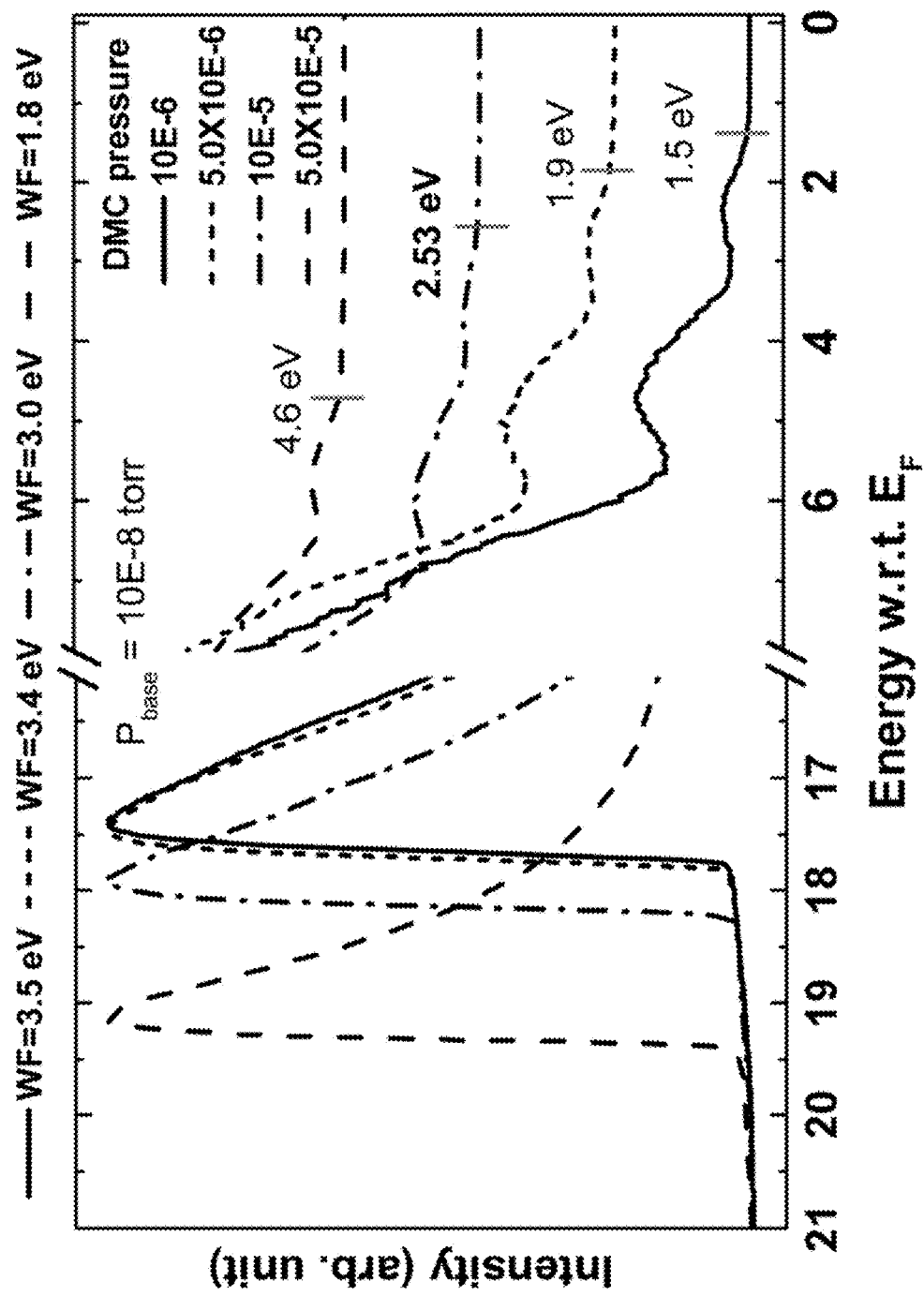
FIG. 10 shows plots of UPS spectra with various DMC vapor pressures.

As mentioned earlier, the DMC vapor pressure was varied to find an optimal DMC doping concentration that can match the HOMO level of the n-type doped spiro-OMeTAD layer, HOMO1, to the valence band maximum of perovskite, VM. FIG. 10 shows plots of UPS spectra with various DMC vapor pressures from $1.0\times10^{-6}$ to $5.0\times10^{-5}$ Torr. As the DMC vapor pressure increases, the HOMO level is observed to shift from 1.5 to 4.6 eV referenced by the Fermi energy level (EF). Based on the UPS measurements, work functions were determined to be approximately 3.5, 3.4, 3.0, and 1.8 eV under the vapor pressures of $1.0\times10^{-6}$, $5.0\times10^{-6}$, $1.0\times10^{-5}$, and $5.0\times10^{-5}$ Torr, respectively. Also, the HOMO leading edge for each vapor pressure was measured to be approximately 1.5, 1.9, 2.5, and 4.6 eV below EF, respectively. These measurements confirm the n-type doing behavior using DMC as the dopant and the possibility to tune the HOMO level of the DMC doped spiro-OMeTAD with respect to the Fermi energy level by varying the DMC vapor pressure.

Figure 11:
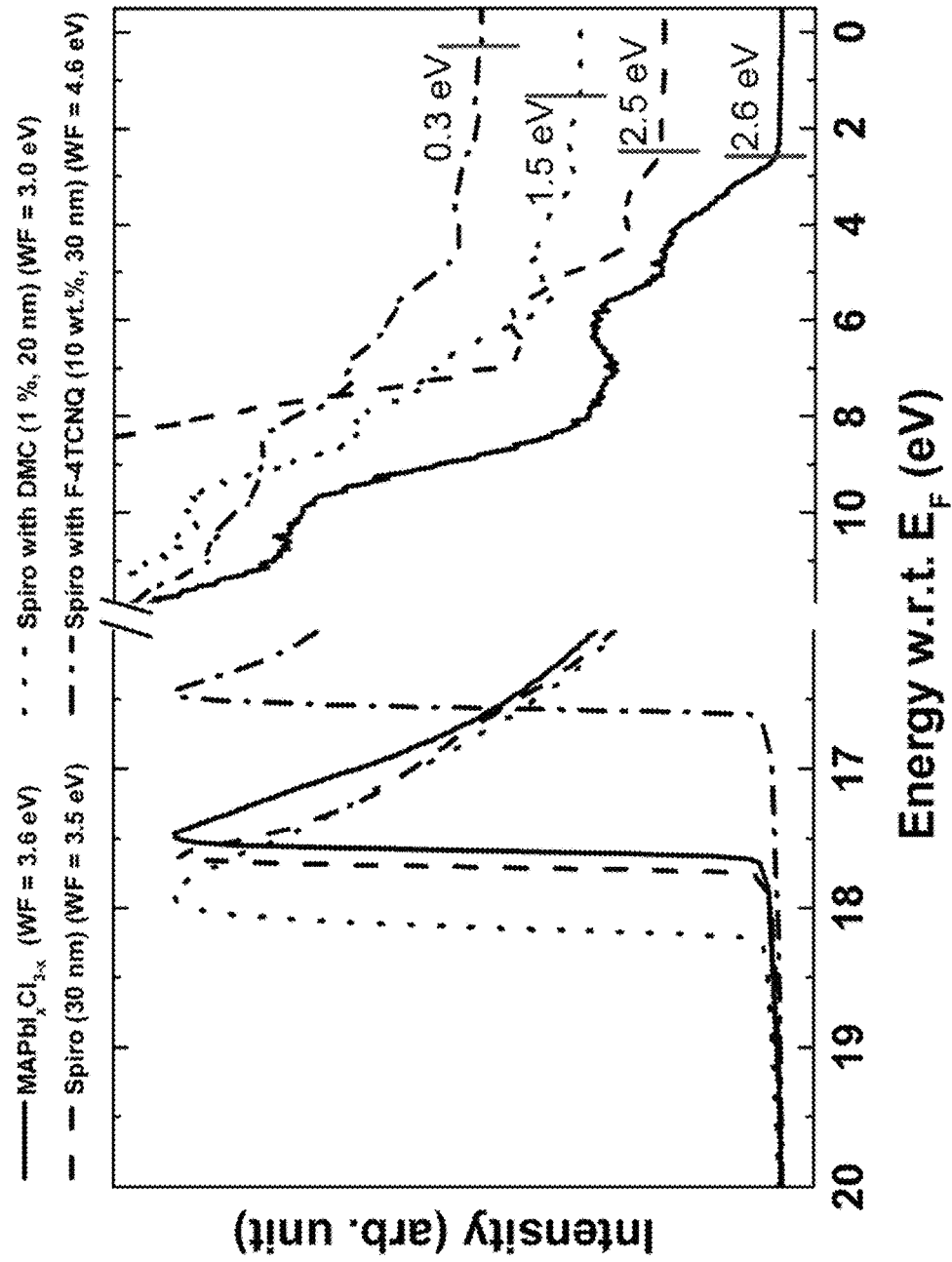
FIG. 11 shows plots of the UPS spectra of the perovskite (MAPbI3-XClX) layer, the n-type (DMC) doped spiro-OMeTAD on top of the perovskite layer, the intrinsic spiro-OMeTAD on top of the n-type doped spiro-OMeTAD, and the p-type doped (F4-TCNQ) spiro-OMeTAD on top of the intrinsic spiro-OMeTAD.

Furthermore, UPS measurements were performed in situ on the n-type doped, intrinsic, and p-type doped spiro-OMeTAD while depositing these layers sequentially on the perovskite layer formed on the FTO substrate pre-coated with the $TiO_2$ compact layer. FIG. 11 shows plots of the UPS spectra of the perovskite ($MAPbI_{3-x}Cl_x$) layer, the n-type (DMC) doped spiro-OMeTAD on top of the perovskite layer, the intrinsic spiro-OMeTAD on top of the n-type doped spiro-OMeTAD, and the p-type doped (F4-TCNQ) spiro-OMeTAD on top of the intrinsic spiro-OMeTAD. The valence band maximum of perovskite was measured to be at ~2.6 eV below EF. An optimal DMC vapor pressure of $1.0\times10^{-5}$ Torr was identified, which enabled the matching between the valence band maximum of perovskite, VM, and the HOMO level of DMC (1%) doped spiro-OMeTAD, HOMO1. In this case, the HOMO1 was measured to be at ~2.5 eV below EF, whereby the difference between the VM and the HOMO1 is only about 0.1 eV, thereby indicating good matching. For the intrinsic layer, the HOMO level was found to be at ~1.5 eV below EF. The HOMO level of F4-TCNQ doped spiro-OMeTAD was found to be at ~0.3 eV below EF. Based on these UPS results, the energy diagram can be determined for the solar cell and correlated with solar cell performance measurements. Referring back to FIG. 2, the energy diagram for the above case is represented with: ΔE(VM)=2.6 eV, ΔE(HOMO1)=2.5 eV, ΔE(HOMO2)=1.5 eV, and ΔE(HOMO3)=0.3 eV.

To make a reference sample (corresponding to A in FIG. 3 and Table 1), a typical solution processing with spin coating was carried out to form an HTL on the perovskite layer. The spin coating was done at 2000 rpm for 60 s using a solution consisting of 59 mM of spiro-OMeTAD, 172 mM of tBP and 32 mM of Li-salt in chlorobenzene.

Stability of solar cell devices was studied based on solar cell performance measurements with time evolution up to 528 h (22 days) in air and in high vacuum with the pressure of $10^{-6}$ Torr. FIGS. 12A-12D show plots of $V_{oc}$, $j_{sc}$, FF and PCE vs. time evolution in days, respectively. These measurements were taken for two reference samples (total of 12 devices) including solution-processed spiro-OMeTAD for the HTL and two samples (total of 12 devices) including n-i-p doped spiro-OMeTAD for the HTL. Table 2 lists solar cell performance parameters extracted from the j-V curves of the samples, measured at 1 sun illumination conditions (100 mW/cm$^2$) for the fresh devices, and after storage in air or vacuum for 6, 20 and 22 days. Each value corresponds to the best-efficiency sample of the batch on the day it was measured, and the value in each pair of brackets corresponds to the average value for all devices in the batch and the associated standard deviation.

TABLE 2

| Sample | Time (days) | $V_{oc}$(V) | $j_{sc}$(mAcm$^{-2}$) | FF (%) | PCE (%) |
|---|---|---|---|---|---|
| reference sample in air | fresh | 0.967 (0.973±0.014) | 23.1 (22.0±2.0) | 60.3 (58.0±4.4) | 13.5 (12.5±1.9) |
| | +6 | 0.920 (0.909±0.028) | 14.2 (11.7±3.4) | 47.8 (47.7±3.8) | 6.3 (5.1±1.7) |
| | +20 | 0.908 (0.897±0.047) | 17.6 (13.9±3_3) | 45.8 (42.2±3.5) | 5.3 (5.3±1.5) |
| reference sample in vacuum | fresh | 0.914 (0.894±0.018) | 19.8 (19.8±0-0.6) | 61.4 (54.8±3.2) | 11.1 (9.3±0.8) |
| | +6 | 1.028 (0.950±0.033) | 20.2 (19.0±1.0) | 65.8 (54.7±6.1) | 13.6 (9.9±1.9) |
| | +20 | 0.885 (0.878±0.012) | 14.0 (15.9±2.7) | 52.6 (44.2±6.0) | 6.5 (6.1±0.6) |
| n-i-p structured HTL in air | fresh | 0.706 (0.711±0.170) | 17.8 (15.9±1.4) | 37.9 (34.4±2.7) | 4.8 (3.6±1.1) |
| | +6 | 0.854 (0.842±0.091) | 17.7 (16.9±0.7) | 52.1 (49.1±4.0) | 7.9 (7.0±1.3) |
| | +22 | 0.901 (0.875 ±0.015) | 17.0 (16.8±0.8) | 51.7 (52.5±2.8) | 7.9 (7.8±0.3) |
| n-i-p structured HTL in vacuum | F resh | 0.819 (0.778±0.037) | 19.4 (19.3±0.3) | 55.7 (48.9±3.8) | 8.9 (7.4±0.9) |
| | +6 | 0.875 (0.829±0.036) | 18.1 (18.4±0.4) | 58.7 (54.7±2.8) | 9.3 (8.5±0.7) |
| | +22 | 0.868 (0.799±0.036) | 18.8 (19.2±0.4) | 53.4 (48.1±2.7) | 8.7 (7.5±0.6) |

Figure 12B:
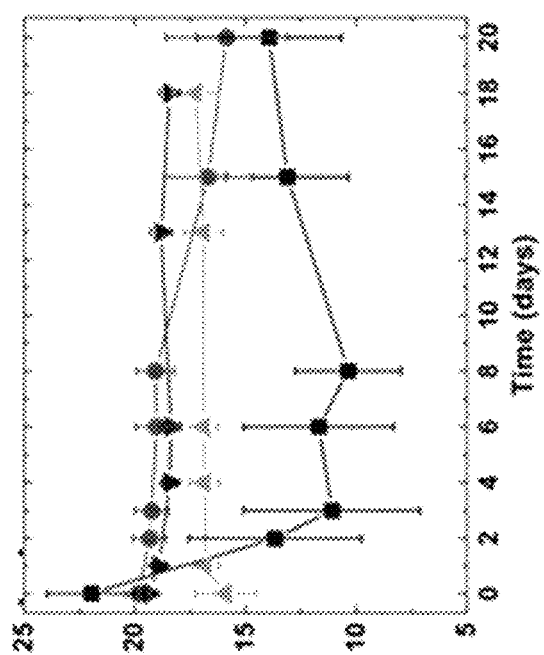
FIGS. 12A-12D show plots of Voc, jsc, FF and PCE vs. time evolution in days, respectively.
Figure 12D:
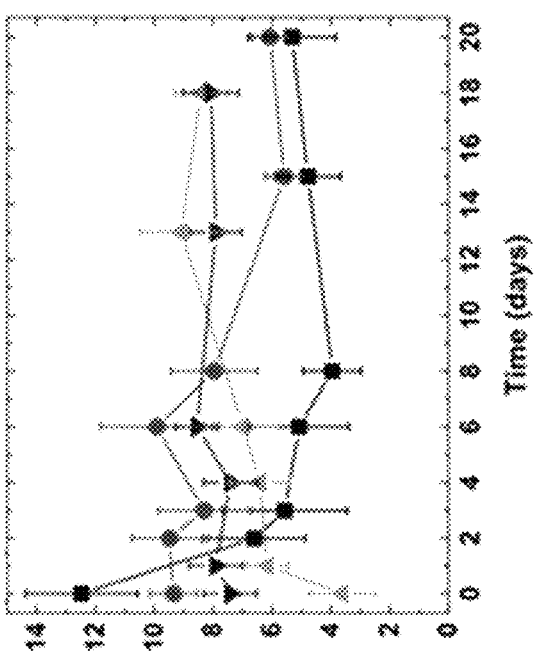
Figure 12A:
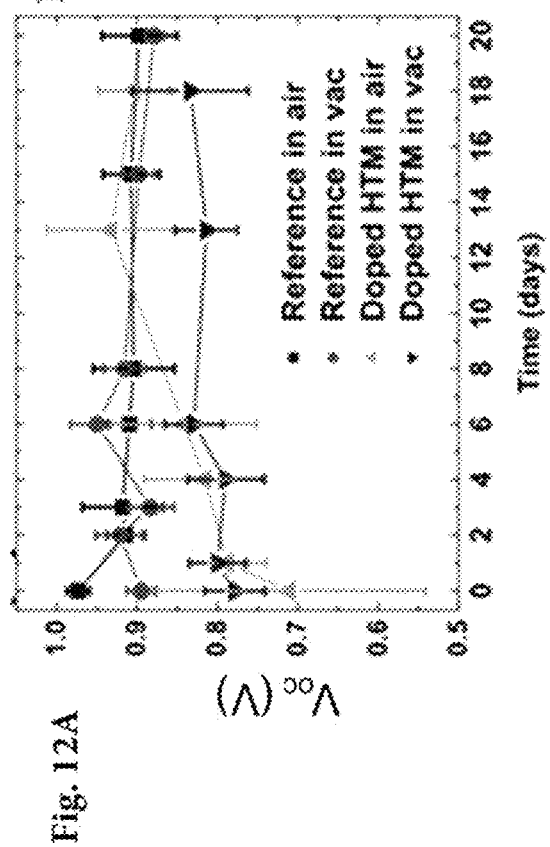
Figure 12C:
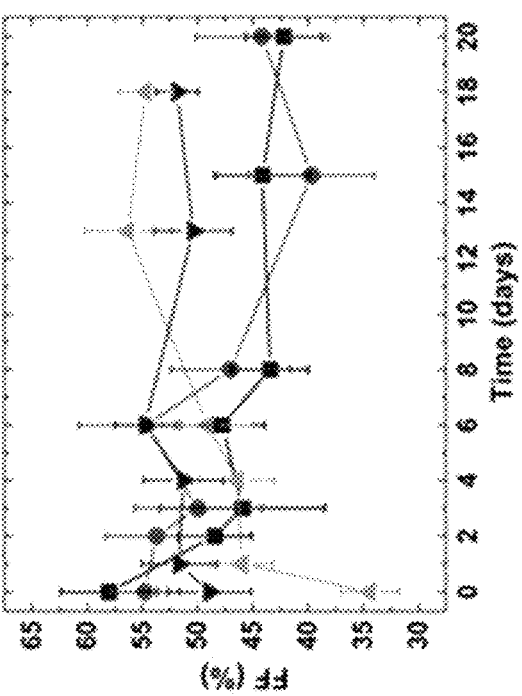

The reference samples in air and in vacuum both degraded significantly over the 20 day period. On the other hand, the samples having the n-i-p structured HTL were stable under both conditions. After 6 days of storage in air or in vacuum, $V_{oc}$ for all samples reached a saturation value of approximately 0.9 V, as shown in FIG. 12A and Table 2. However, $j_{sc}$ of the reference samples with storage in air and in vacuum both decreased drastically from 23.1 to 14.0 mA/cm$^2$, as shown in FIG. 12B. On the other hand, the samples having the n-i-p structured HTL with storage in air and in vacuum were stable with a value of 18.0 mA/cm$^2$, as shown in Table 2. The FF values of the reference samples started to degrade after 1 day, and the n-i-p doped samples were stable, as shown in FIG. 12C. The PCE values also showed a similar trend, as shown in FIG. 12D. The PCE values of reference samples stored in air decreased quickly from 13.5 to 6.3% after 2 days. Even the reference samples stored in vacuum showed decreased efficiency from 11.1 to 6.5%. On the other hand, the efficiency for the samples having the n-i-p structured HTL with storage in air and in vacuum increased from 7 to 9.3%, and showed good stability even after 6 days. After 22 days, the PCE of doped samples in both conditions still had 7.8(±0.3) and 7.9(±0.6) % on average, as shown in Table 2.

It is observed in FIG. 12D that the efficiency of solar cells with the n-i-p structured HTL have tendency to increase as a function of time, almost doubling after 2~3 days. Dopant diffusion experiments were performed to shed light on this behavior. It was found that inter-diffusion of the n-dopant into the intrinsic layer occurs, which is considered to be the main cause for enhancing carrier transport properties, thereby increasing the efficiency.

In the above example, DMC was chosen for the n-dopant, F4-TCNQ for the p-dopant, and spiro-OMeTAD for the HTM. However, as mentioned earlier, there are a wide variety of n-type dopant materials, p-type dopant materials and HTMs suitable for fabricating perovskite-based devices. Another example of the present study used $MoO_3$ for the p-dopant. In this example, the HTL comprising the DMC-doped spiro-OMeTAD layer with a thickness of ~20 nm, the intrinsic spiro-OMeTAD layer with a thickness of 10-20 nm, and the $MoO_3$-doped spiro-OMeTAD layer with a thickness of 5-10 nm, was fabricated by using the vacuum evaporation based two-chamber process as in the previous example. The deposition rate of the p-dopant ($MoO_3$) was 0.1 angstrom/s. The p-doped layer was made thinner in this example for the purpose of increasing the work function of the subsequently formed metal electrode, leading to higher open circuit voltage $V_{oc}$. Au, Ag, Al or other suitable metal can be used for the electrode; in general, the use of Al for the metal electrode helps reduce the fabrication cost.

As described thus far, organometal halide perovskite based solar cells using a triple-layer of n-type doped, intrinsic and p-type doped HTL, fabricated by vacuum evaporation, show substantially improved air stability compared to the solar cells with solution-processed HTLs. It is considered that the improvement in air stability results from substantially less pinholes in the HTL fabricated by vacuum evaporation than normally present in a solution-processed HTL. The doping concentration for the n-type doped sublayer of the HTL is optimized to match the HOMO level with the valence band maximum of perovskite for efficient hole extraction while maintaining a high open circuit voltage, thereby leading to the conductivity higher than that in the solar cell with the undoped and/or p-type doped HTL. In addition to solar cell applications, the present n-i-p doped HTL structure and its variations based on the present fabrication technique can be used for other perovskite-based optoelectronic devices such as LEDs and lasers as well.

Doping engineering is a widely known technique used to modulate electronic properties of semiconductors. Doping engineered structures of HTLs or ETLs in organic light emitting devices have been reported in some prior art references. It should be noted, however, that these typical hole transport layers include only an undoped HTL and/or a p-type doped HTL, because it is counter-intuitive, hence unconventional, for one of ordinary skill in the art to dope a hole transport material with a n-type dopant. In marked contrast, the embodiments based on the present studies consider the n-doped HTL with a predetermined level of doping concentration that can cause the Fermi energy level in the n-doped HTL to shift toward the LUMO of the n-doped HTL, so that the HOMO level of the n-doped HTL can match with the valence band maximum of the perovskite layer, which is adjacent to the n-doped HTL.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. An optoelectronic device comprising:
an active layer comprising organometal halide perovskite; and
a hole transport layer (HTL) formed by vacuum evaporation and configured to transport hole carriers, the HTL comprising a first sublayer comprising a hole transport material (HTM) doped with an n-dopant and disposed adjacent to the active layer, a second sublayer comprising the HTM that is undoped and disposed adjacent to the first sublayer, and a third sublayer comprising the HTM doped with a p-dopant and disposed adjacent to the second sublayer.

2. The optoelectronic device of claim 1, wherein
the active layer has a valence band maximum energy level;
the first sublayer has a first highest occupied molecular orbital (HOMO) energy level, which matches with the valence band maximum energy level;
the second sublayer has a second HOMO energy level, which is higher than the first HOMO energy level; and
the third sublayer has a third HOMO energy level, which is higher than the second HOMO energy level.

3. The optoelectronic device of claim 2, wherein
a doping concentration of the n-dopant for the first sublayer is determined to match the first HOMO energy level with the valence band maximum energy level.

4. The optoelectronic device of claim 3, wherein
the n-dopant is a volatile material, wherein the doping concentration is determined based on a vapor pressure of the n-dopant during co-evaporation of the HTM and the n-dopant for forming the first sublayer, or
the n-dopant is a non-volatile material, wherein the doping concentration is determined based on a ratio between deposition rates of the HTM and the n-dopant during co-evaporation of the HTM and the n-dopant for forming the first sublayer.

5. The optoelectronic device of claim 1, wherein
the HTL formed by the vacuum evaporation includes pinholes less than generally present in an HTL formed by a solution method.

6. The optoelectronic device of claim 1, wherein
the optoelectronic device is a solar cell; and
the active layer is configured to convert photons to charge carries for the solar cell, wherein the solar cell is more stable than a solar cell including an HTL formed by a solution method.

7. A method of fabricating an optoelectronic device comprising:

forming an active layer comprising organometal halide perovskite; and forming by vacuum evaporation a hole transport layer (HTL) for use for transporting hole carriers, wherein the forming the HTL comprises:

forming a first sublayer adjacent to the active layer and comprising a hole transport material (HTM) doped with an n-dopant by co-evaporating the HTM and the n-dopant;

forming a second sublayer adjacent to the first sublayer and comprising the HTM that is undoped by evaporating the HTM; and forming a third sublayer adjacent to the second sublayer and comprising the HTM doped with a p-dopant by co-evaporating the HTM and the p-dopant.

8. The method of claim 7, wherein the forming the first sublayer includes forming the first sublayer that has a first highest occupied molecular orbital (HOMO) energy level, which matches with a valence band maximum energy level of the active layer;

the forming the second sublayer includes forming the second sublayer that has a second HOMO energy level, which is higher than the first HOMO energy level; and the forming the third sublayer includes forming the third sublayer that has a third HOMO energy level, which is higher than the second HOMO energy level.

9. The method of claim 8, further comprising:

determining a doping concentration of the n-dopant for the first sublayer to match the first HOMO energy level with the valence band maximum energy level.

10. The method of claim 9, wherein the determining the doping concentration of the n-dopant includes: varying a vapor pressure of the n-dopant during the co-evaporation to find a vapor pressure value corresponding to the doping concentration; or varying a ratio between deposition rates of the HTM and the n-dopant during the co-evaporation to find a ratio value corresponding to the doping concentration.

11. The method of claim 7, wherein the n-dopant is a volatile material and the p-dopant is a non-volatile material;

the forming the first sublayer includes using a first vacuum evaporation system comprising a first evaporation unit coupled to a side section of a chamber and a second evaporation unit coupled to a bottom section of the chamber, for generating vapors of the n-dopant and the HTM, respectively; and the forming the third sublayer includes using a second vacuum evaporation system comprising two evaporation units coupled to a bottom section of a chamber, for generating vapors of the p-dopant and the HTM respectively, the method further comprising:

after the forming the second sublayer by using the first vacuum evaporation system, transferring a sample comprising the active layer, the first sublayer and the second sublayer from the first vacuum evaporation system to the second vacuum evaporation system; or after the forming the first sublayer by using the first vacuum evaporation system, transferring a sample comprising the active layer and the first sublayer from the first vacuum evaporation system to the second vacuum evaporation system, wherein the forming the second sublayer includes using the second vacuum evaporation system.

12. The method of claim 7, wherein the n-dopant is a volatile material and the p-dopant is a non-volatile material; and the forming the first, second and third sublayers includes using a vacuum evaporation system comprising a first evaporation unit coupled to a side section of a chamber for generating vapor of the n-dopant, a second evaporation unit coupled to a bottom section of the chamber for generating vapor of the p-dopant, and a third evaporation unit coupled to the bottom section of the chamber for generating vapor of the HTM.

13. The method of claim 7, wherein the n-dopant is a non-volatile material and the p-dopant is a non-volatile material; and the forming the first, second and third sublayers includes using a vacuum evaporation system comprising three evaporation units coupled to a bottom section of a chamber for generating vapors of the n-dopant, the p-dopant and the HTM, respectively, and three monitors for monitoring deposition rates of the n-dopant, the p-dopant and the HTM, respectively.

14. The method of claim 7, wherein the n-dopant is a volatile material and the p-dopant is a volatile material; and the forming the first, second and third sublayers includes using a vacuum evaporation system comprising a first evaporation unit coupled to a side section of a chamber for generating vapor of the n-dopant, a second evaporation unit coupled to the side section of the chamber for generating vapor of the p-dopant, and a third evaporation unit coupled to a bottom section of the chamber for generating vapor of the HTM.

15. The method of claim 7, wherein the n-dopant is a non-volatile material and the p-dopant is a volatile material; and the forming the first, second and third sublayers includes using a vacuum evaporation system comprising a first evaporation unit coupled to a side section of a chamber for generating vapor of the p-dopant, a second evaporation unit coupled to a bottom section of the chamber for generating vapor of the n-dopant, and a third evaporation unit coupled to the bottom section of the chamber for generating vapor of the HTM.

* * * * *